United States Patent
Yamatsu et al.

(10) Patent No.: US 11,674,032 B2
(45) Date of Patent: Jun. 13, 2023

(54) ENCAPSULATION RESIN COMPOSITION, LAMINATED SHEET, CURED PRODUCT, SEMICONDUCTOR DEVICE, AND METHOD FOR FABRICATING SEMICONDUCTOR DEVICE

(71) Applicant: Panasonic Intellectual Property Management Co., Ltd., Osaka (JP)

(72) Inventors: Shigeru Yamatsu, Osaka (JP); Kazuki Watanabe, Osaka (JP); Naoki Kanagawa, Mie (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 117 days.

(21) Appl. No.: 16/970,596

(22) PCT Filed: Feb. 21, 2019

(86) PCT No.: PCT/JP2019/006432
§ 371 (c)(1),
(2) Date: Aug. 17, 2020

(87) PCT Pub. No.: WO2019/163861
PCT Pub. Date: Aug. 29, 2019

(65) Prior Publication Data
US 2020/0377715 A1    Dec. 3, 2020

(30) Foreign Application Priority Data
Feb. 21, 2018    (JP) ............................ JP2018-029183

(51) Int. Cl.
C08L 51/08    (2006.01)
C08F 290/06    (2006.01)
(Continued)

(52) U.S. Cl.
CPC ............ C08L 51/08 (2013.01); C08F 290/06 (2013.01); H01L 21/4853 (2013.01);
(Continued)

(58) Field of Classification Search
CPC .... C08L 51/08; C08L 2203/206; C08L 71/12; C08F 290/06; C08F 285/00;
(Continued)

(56) References Cited

U.S. PATENT DOCUMENTS

2007/0276066 A1* 11/2007 Ohno ....................... C08L 33/06
    524/277
2015/0348861 A1* 12/2015 Chia ....................... H01L 24/97
    438/118
(Continued)

FOREIGN PATENT DOCUMENTS

JP    2005-093788    4/2005
JP    2011-140617    7/2011
(Continued)

OTHER PUBLICATIONS

Official Communication issued in International Patent Application No. PCT/JP2019/006432, dated May 7, 2019, along with an English translation thereof.

*Primary Examiner* — Thanh T Nguyen
(74) *Attorney, Agent, or Firm* — Greenblum & Bernstein, P.L.C.

(57) ABSTRACT

An encapsulation resin composition is used to hermetically seal a gap between a base member and a semiconductor chip bonded onto the base member. The encapsulation resin composition has a reaction start temperature of 160° C. or less. A melt viscosity of the encapsulation resin composition is 200 Pa·s or less at the reaction start temperature, 400 Pa·s or less at any temperature which is equal to or higher than a temperature lower by 40° C. than the reaction start (Continued)

temperature and which is equal to or lower than the reaction start temperature, and 1,000 Pa·s or less at a temperature lower by 50° C. than the reaction start temperature.

8 Claims, 3 Drawing Sheets

(51) Int. Cl.
  *H01L 21/48*   (2006.01)
  *H01L 21/56*   (2006.01)
  *H01L 23/29*   (2006.01)
  *H01L 23/31*   (2006.01)
  *H01L 23/00*   (2006.01)

(52) U.S. Cl.
  CPC .......... *H01L 21/563* (2013.01); *H01L 23/295* (2013.01); *H01L 23/3185* (2013.01); *H01L 24/16* (2013.01); *H01L 24/81* (2013.01); *C08L 2203/206* (2013.01); *H01L 2224/16227* (2013.01); *H01L 2224/81207* (2013.01); *H01L 2924/067* (2013.01); *H01L 2924/18161* (2013.01)

(58) Field of Classification Search
  CPC ............. C08F 290/062; H01L 21/4853; H01L 21/563; H01L 23/295; H01L 23/3185; H01L 24/16; H01L 24/81; H01L 2224/16227; H01L 2224/81207; H01L 2924/067; H01L 2924/18161; H01L 21/6836; H01L 24/27; H01L 24/29; H01L 24/83; H01L 24/92; H01L 24/13; H01L 24/17; H01L 24/32; H01L 24/75; H01L 24/94; H01L 2221/68327; H01L 2224/13082; H01L 2224/13111; H01L 2224/17181; H01L 2224/271; H01L 2224/2919; H01L 2224/2929; H01L 2224/29499; H01L 2224/32058; H01L 2224/32105; H01L 2224/32106; H01L 2224/73104; H01L 2224/75251; H01L 2224/75252; H01L 2224/75343; H01L 2224/81203; H01L 2224/81447; H01L 2224/81905; H01L 2224/83203; H01L 2224/83207; H01L 24/73; H01L 2224/32225; H01L 2224/81191; H01L 2224/83862; H01L 2224/83905; H01L 2224/92; H01L 2224/9211; H01L 2224/94; H01L 25/0657; H01L 23/293; H01L 2224/16145; H01L 2224/32145; H01L 2224/73204; H01L 2224/83191; H01L 23/31; H01L 2224/81; H01L 2924/00; C09D 151/003; C09D 151/08; C08K 3/013

See application file for complete search history.

(56) References Cited

U.S. PATENT DOCUMENTS

2019/0284442 A1 9/2019 Watanabe et al.
2020/0010675 A1 1/2020 Yamatsu et al.

FOREIGN PATENT DOCUMENTS

WO 2018/030112 2/2018
WO 2018/030113 2/2018

* cited by examiner

ENCAPSULATION RESIN COMPOSITION, LAMINATED SHEET, CURED PRODUCT, SEMICONDUCTOR DEVICE, AND METHOD FOR FABRICATING SEMICONDUCTOR DEVICE

TECHNICAL FIELD

The present invention generally relates to an encapsulation resin composition, a laminated sheet, a cured product, a semiconductor device, and a method for fabricating the semiconductor device. More particularly, the present invention relates to an encapsulation resin composition suitably used to hermetically seal the gap between a base member and a semiconductor chip, a laminated sheet, a cured product of the encapsulation resin composition, a semiconductor device including an encapsulant made of the cured product, and a method for fabricating a semiconductor device including the encapsulant.

BACKGROUND ART

As underfilling techniques using a pre-applied process, not only a technique that uses a resin composition in liquid phase at an ordinary temperature (which is called a "non-conductive paste process" and also called an "NCP process") but also a technique that uses a sheet of resin composition (which is called a "non-conductive film process" and also called an "NCF process") are known as well (see, for example, Patent Literature 1).

When a semiconductor device is fabricated by bonding a semiconductor chip onto a substrate as disclosed in Patent Literature 1, a sheet of resin composition may be stacked over a semiconductor chip before the semiconductor chip is picked up with a bonding head and mounted onto the substrate in such a state. Heating the bonding head in this state causes the resin composition and bump electrodes to be heated as well. This allows solder of the bump electrodes to be melted, thus connecting the bump electrodes to conductor wiring of the substrate and curing the resin composition to make an encapsulant as well.

CITATION LIST

Patent Literature

Patent Literature 1: JP 2011-140617 A

SUMMARY OF INVENTION

An object of the present invention is to provide an encapsulation resin composition with the ability to reduce, even if an encapsulant is formed by heating the encapsulation resin composition placed in the gap between a base member and a semiconductor chip and subjecting the encapsulation resin composition to ultrasonic vibrations, the number of residual voids left in the encapsulant.

Another object of the present invention is to provide a laminated sheet made of the encapsulation resin composition, a cured product of the encapsulation resin composition, a semiconductor device including an encapsulant made of the cured product, and a method for fabricating such a semiconductor device.

An encapsulation resin composition according to an aspect of the present invention is used to hermetically seal a gap between a base member and a semiconductor chip bonded onto the base member. The encapsulation resin composition has a reaction start temperature of 160° C. or less. A melt viscosity of the encapsulation resin composition is 200 Pa·s or less at the reaction start temperature, 400 Pa·s or less at any temperature which is equal to or higher than a temperature lower by 40° C. than the reaction start temperature and which is equal to or lower than the reaction start temperature, and 1,000 Pa·s or less at a temperature lower by 50° C. than the reaction start temperature.

A laminated sheet according to another aspect of the present invention includes: the encapsulation resin composition having a sheet shape; and a supporting sheet to support the encapsulation resin composition thereon.

A cured product according to still another aspect of the present invention is obtained by thermally curing the encapsulation resin composition described above.

A semiconductor device according to yet another aspect of the present invention includes: a base member; a semiconductor chip bonded facedown onto the base member; and an encapsulant to hermetically seal a gap between the base member and the semiconductor chip. The encapsulant is made of the cured product described above.

A method for fabricating a semiconductor device according to yet another aspect of the present invention includes: arranging a semiconductor chip having bump electrodes on one surface, having conductor wiring, of a base member with the encapsulation resin composition described above interposed between the semiconductor chip and the base member such that the conductor wiring faces the bump electrodes; and applying ultrasonic vibrations to the encapsulation resin composition while heating the encapsulation resin composition to cure the encapsulation resin composition and electrically connect the conductor wiring to the bump electrodes.

DESCRIPTION OF EMBODIMENTS

Figure 1A:
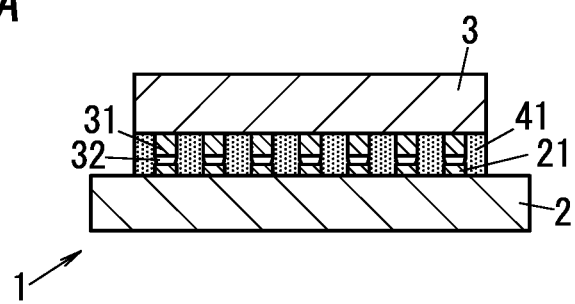
FIG. 1A is a schematic cross-sectional view illustrating a semiconductor device according to an exemplary embodiment of the present invention.

First, it will be described exactly how the present inventors perfected our invention.

To bond a flip-chip type semiconductor chip facedown onto a base member, a so-called "underfilling technique" for sealing the gap between the base member and the semiconductor chip by filling the gap with a resin composition after the semiconductor chip has been mounted onto the base member is often used as a well-known technique.

In fabricating a semiconductor device, the pitch of bump electrodes thereof is required to be even narrower in order to meet the growing demand for reducing the overall size, weight, and thickness of the semiconductor device. Thus, a pre-applied process is adopted as the underfilling technique. According to the pre-applied process, a base member with conductor wiring, a semiconductor chip with bump electrodes, and a resin composition in liquid phase at an ordinary temperature may be provided, for example. The resin composition is placed in position on the base member, the semiconductor chip is mounted at the position where the resin composition is placed on the base member, and bump electrodes are arranged on the conductor wiring. In this state, the resin composition and the bump electrodes are heated to cure the resin composition and thereby form an encapsulant and electrically connect the bump electrodes to the conductor wiring.

As the underfilling techniques using such a pre-applied process, not only a technique that uses a resin composition in liquid phase at an ordinary temperature (which is called a "non-conductive paste process" and also called an "NCP process") but also a technique that uses a sheet of resin composition (which is called a "non-conductive film process" and also called an "NCF process") are known as well (see, for example, JP 2011-140617 A).

When a semiconductor device is fabricated by bonding a semiconductor chip onto a substrate as disclosed in JP 2011-140617 A, a sheet of resin composition may be laid over a semiconductor chip before the semiconductor chip is picked up with a bonding head and mounted on the substrate in such a state. Heating the bonding head in this state causes the resin composition and bump electrodes to be heated as well. This allows solder of the bump electrodes to be melted, thus connecting the bump electrodes to conductor wiring of the substrate and curing the resin composition to make an encapsulant as well.

According to the method disclosed in JP 2011-140617 A, to melt the solder of the bump electrodes, the resin composition and the bump electrodes are heated to a relatively high temperature of about 180° C. to about 260° C. Therefore, to bond semiconductor chips onto the substrate repeatedly, the bonding head needs to be cooled every time a semiconductor chip is bonded, lest the resin composition should be cured before connected to the bump electrodes and the conductor wiring. That is why the bonding head needs to have its temperature raised and lowered repeatedly, thus causing a decline in the productivity of the semiconductor device.

However, bonding the bump electrodes to the conductor wiring by applying ultrasonic vibrations to the bump electrodes eliminates the need to melt the solder of the bump electrodes at a high temperature, thus allowing a lower heating temperature to be adopted. This obviates the need to cool the bonding head. In that case, however, the ultrasonic vibrations applied would produce voids in the resin composition or would make the voids produced tiny enough to increase the chances of the tiny voids being left in the encapsulant, made from the encapsulation resin composition, in the gap between the bump electrodes and the conductor wiring. The presence of such residual voids in the encapsulant causes a decline in the performance of the semiconductor device.

Thus, the present inventors acquired the basic idea of our invention for overcoming such a problem by providing an encapsulation resin composition with the ability to reduce, even if an encapsulant is formed by heating the encapsulation resin composition placed in the gap between the base member and the semiconductor chip and subjecting the encapsulation resin composition to ultrasonic vibrations, the number of residual voids left in the encapsulant.

Next, an exemplary embodiment of the present invention will be described. As used herein, "(meth)acrylic-" is a generic term for "acrylic-" and "methacrylic-." For example, a (meth)acryloyl group is a generic term for an acryloyl group and a methacryloyl group. Also, the solid content of the encapsulation resin composition herein refers to the content of the encapsulation resin composition from which volatile components such as a solvent are removed.

An encapsulation resin composition according to this embodiment is used to hermetically seal a gap between a base member 2 and a semiconductor chip 3 bonded onto on the base member 2. The encapsulation resin composition has a reaction start temperature of 160° C. or less. A melt viscosity of the encapsulation resin composition is 200 Pa·s or less at the reaction start temperature of the encapsulation resin composition, 400 Pa·s or less at any temperature which is equal to or higher than a temperature lower by 40° C. than the reaction start temperature and which is equal to or lower than the reaction start temperature, and 1,000 Pa·s or less at a temperature lower by 50° C. than the reaction start temperature.

Figure 3A:
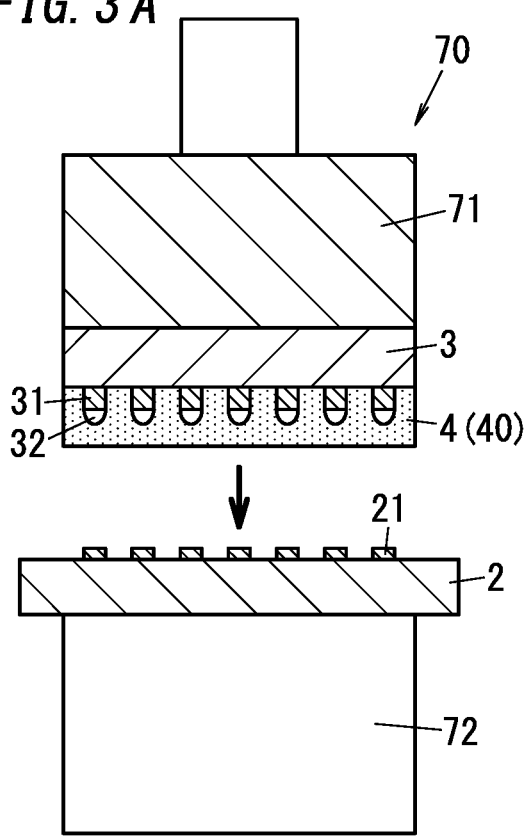
FIGS. 3A-3D are schematic cross-sectional views illustrating respective process steps of bonding a semiconductor chip onto a base member according to an exemplary embodiment of the present invention.
Figure 3B:
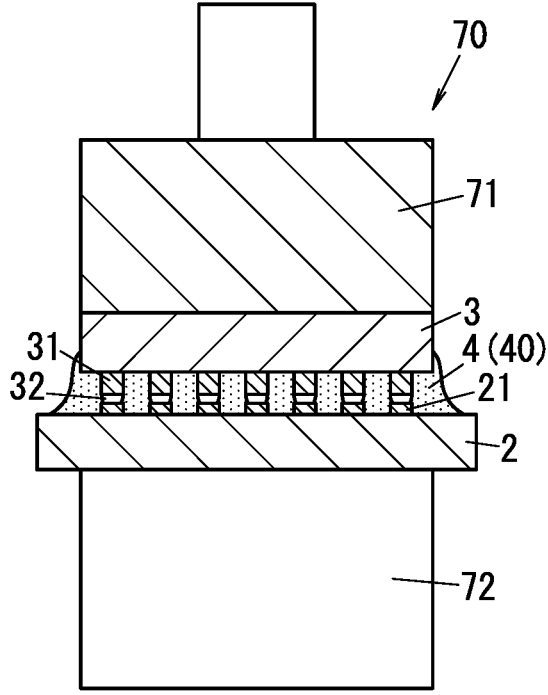
Figure 3C:
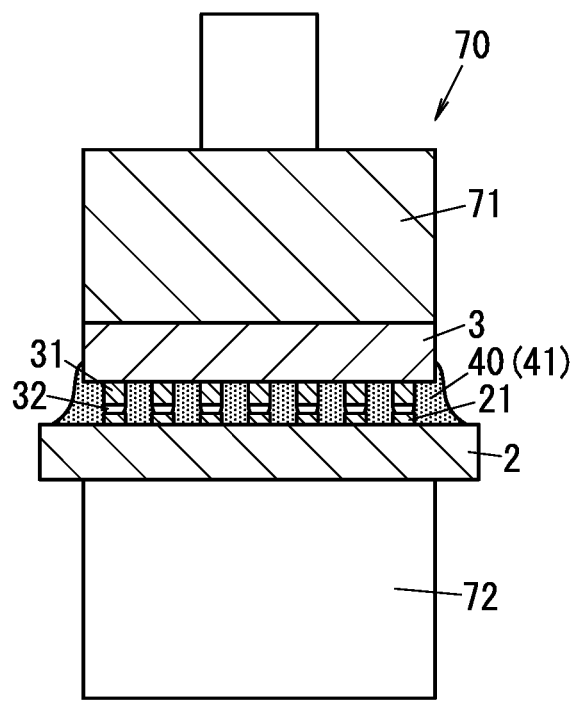

This embodiment reduces, even if an encapsulant 41 is formed by heating the encapsulation resin composition placed in the gap between the base member 2 and the semiconductor chip 3 and subjecting the encapsulation resin composition to ultrasonic vibrations, the number of residual voids left in the encapsulant 41 (see FIGS. 3A-3C).

Figure 1B:
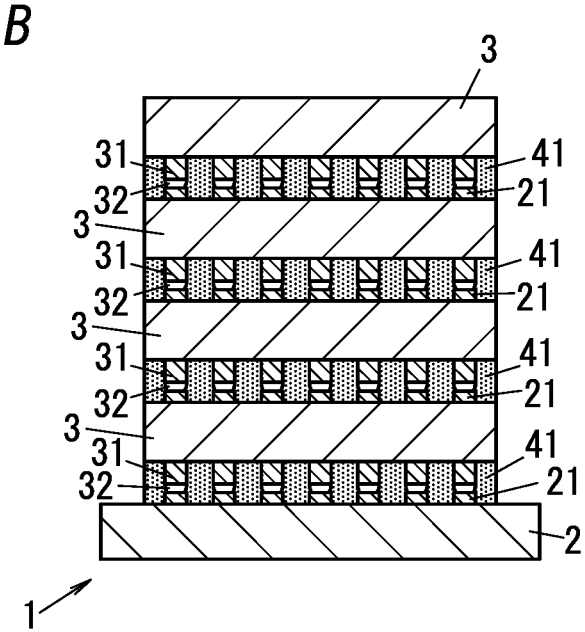
FIG. 1B is a schematic cross-sectional view illustrating a semiconductor device according to another exemplary embodiment of the present invention.

In addition, this embodiment also provides a laminated sheet 6 made from the encapsulation resin composition (see FIG. 2), a cured product of the encapsulation resin composition, and a semiconductor device 1 including an encapsulant 41 made of the cured product (see FIGS. 1A and 1B).

In this embodiment, the melt viscosity and the reaction start temperature are obtained from a melt viscosity curve showing the relationship between the temperature and the melt viscosity in a situation where the melt viscosity is measured with the temperature of the resin composition raised. Specifically, a temperature at which the melt viscosity starts rising in the melt viscosity curve is the reaction start temperature. An encapsulation resin composition, for example, melts and comes to have a decreased viscosity within a certain temperature range as the temperature is raised. Allowing a component in the encapsulation resin composition to start reaction at the temperature at which the melt viscosity starts to rise causes the melt viscosity to start rising as well. The reaction start temperature varies according to the chemical makeup of the encapsulation resin composition and is controllable by appropriately adjusting the components in the encapsulation resin composition. In this embodiment, the reaction start temperature herein refers to a temperature higher than a temperature corresponding to the lowest melt viscosity in the melt viscosity curve of the encapsulation resin composition and is a temperature at a viscosity higher by 50 Pa·s than the lowest melt viscosity.

Specifically, the melt viscosity and the reaction start temperature may be obtained by the following method.

First, the temperature dependence of the melt viscosity of the encapsulation resin composition is measured using a rheometer under the condition including a temperature range from 100° C. to 300° C., a temperature rise rate of 60° C./min, and an angular velocity of 0.209 rad/s.

In this manner, a melt viscosity curve is obtained. As the rheometer for use in this measurement, a rheometer with the model number AR2000ex manufactured by TA Instruments, Inc. may be used, for example. Detecting, from the melt viscosity curve thus obtained, the lowest melt viscosity and a temperature corresponding to a melt viscosity that has increased by 50 Pa·s from the lowest melt viscosity allows the reaction start temperature of the encapsulation resin composition to be obtained.

In making the encapsulant 41 from the encapsulation resin composition, the encapsulation resin composition placed in the gap between the base member 2 and the semiconductor chip 3 is heated and subjected to ultrasonic vibrations. When heated, the encapsulation resin composition melts and flows. In addition, when subjected to ultrasonic vibrations, the encapsulation resin composition bonds the conductor wiring 21 on the base member 2 to the bump electrodes 31 of the semiconductor chip 3. When further heated, the encapsulation resin composition cures to make the encapsulant 41.

As described above, the melt viscosity of the encapsulation resin composition according to this embodiment is 200 Pa·s or less at the reaction start temperature. Thus, setting the temperature of heating the encapsulation resin composition at a temperature around the reaction start temperature when making the encapsulant 41 allows the melt viscosity when the encapsulation resin composition melts to be lowered. This allows residual voids, if any, to be easily removed out of the encapsulation resin composition.

In addition, even at a temperature lower by 50° C. than the reaction start temperature, the encapsulation resin composition has a relatively low melt viscosity of 1,000 Pa·s or less. Thus, this reduces, even when the temperature becomes non-uniform in the encapsulation resin composition melted, the chances of producing a highly viscous part in the encapsulation resin composition. Consequently, this reduces the chances of the highly viscous part obstructing the removal of the voids.

In addition, setting the heating temperature at a temperature in the vicinity of the reaction start temperature allows the curing reaction of the encapsulation resin composition to advance quickly after the encapsulation resin composition has melted, thus causing the viscosity of the encapsulation resin composition to rise steeply. This reduces the chances of the ultrasonic vibrations newly producing voids due to the presence of low molecular components in the encapsulation resin composition. Consequently, this reduces the chances of voids being left in the encapsulant 41 made from the encapsulation resin composition.

Furthermore, the melt viscosity of the encapsulation resin composition is 400 Pa·s or less at any temperature which is equal to or higher than a temperature lower by 40° C. than the reaction start temperature and which is equal to or lower than the reaction start temperature. This allows the encapsulation resin composition to have low viscosities in a broad temperature range in the vicinity of the reaction start temperature. This facilitates setting the heating temperature when making the encapsulant 41.

Note that the reaction start temperature of the encapsulation resin composition is a measured value obtained by measuring the melt viscosity under a certain condition as described above. Thus, the reaction start temperature of the encapsulation resin composition is different from a temperature at which the reaction of the encapsulation resin composition actually starts. The curing reaction of the encapsulation resin composition may advance even at a temperature lower than the reaction start temperature. Therefore, setting the heating temperature in the vicinity of the reaction start temperature when making the encapsulant 41 allows the curing reaction of the encapsulation resin composition to advance even if the heating temperature is lower than the reaction start temperature.

As can be seen from the foregoing description, the encapsulation resin composition according to this embodiment reduces, even if an encapsulant 41 is formed by heating, at a relatively low temperature, the encapsulation resin composition placed in the gap between the base member 2 and the semiconductor chip 3 and subjecting the encapsulation resin composition to ultrasonic vibrations, the number of residual voids left in the encapsulant 41. Thus, in a situation where the semiconductor chip 3 is flip-chip bonded onto the base member 2, this reduces the number of residual voids left in the encapsulant 41 even if the encapsulation resin composition is heated and the bump electrodes 31 of the semiconductor chip 3 are bonded onto the conductor wiring 21 on the base member 2 with ultrasonic vibrations.

The reaction start temperature suitably falls within the range from 100° C. to 160° C. In that case, even when the temperature of heating the encapsulation resin composition is relatively low in making the encapsulant 41, the number of voids left in the encapsulant 41 may be reduced as described above. In addition, applying ultrasonic vibrations while heating the encapsulation resin composition in bonding the semiconductor chip allows electrical connection to be established between the base member and the semiconductor chip even if the heating temperature is lowered compared to a situation where no ultrasonic vibrations are applied. Setting the reaction start temperature at a temperature falling within the range from 100° C. to 160° C. also reduces the number of voids left in the encapsulant 41 even if the heating temperature is lowered when the application of ultrasonic vibrations is adopted as well. The heating temperature is suitably equal to or higher than a temperature lower by 30° C. than the reaction start temperature. This would achieve the advantages of this embodiment significantly. The heating temperature is more suitably equal to or higher than the temperature lower by 30° C. than the reaction start temperature and equal to or lower than the temperature higher by 10° C. than the reaction start temperature, and even more suitably falls within the range from 100° C. to 150° C.

Such a behavior of the melt viscosity in the encapsulation resin composition is achieved by appropriately selecting components in the encapsulation resin composition and properly adjusting the contents of those components in the encapsulation resin composition. Next, an exemplary chemical makeup for the encapsulation resin composition to achieve such a melt viscosity behavior will be described.

The encapsulation resin composition suitably contains an acrylic compound as Component (A) (hereinafter simply referred to as an "acrylic compound (A)"), a polyphenylene ether resin having a substituent (b1) with radical polymerization properties as Component (B) (hereinafter simply referred to as a "polyphenylene ether resin (B)"), and a thermal radical polymerization initiator as Component (C) (hereinafter simply referred to as a "thermal radical polymerization initiator (C)"). The encapsulation resin composition containing these components further reduces the number of residual voids left in the cured product of the encapsulation resin composition. In addition, this also reduces the chances of the encapsulant 41 made of the cured product of the encapsulation resin composition peeling off the base member 2. Thus, sealing the gap between the base member 2 and the semiconductor chip 3 with the cured product of this encapsulation resin composition would increase the degree of reliability of the semiconductor device 1. Moreover, the encapsulation resin composition containing the polyphenylene ether resin (B) among other things facilitates adjustment of the melt viscosity of the encapsulation resin composition such that the encapsulation resin composition may have a low melt viscosity. Furthermore, the polyphenylene ether resin (B) includes a substituent (b1) with radical polymerization properties. Thus, when the encapsulation resin composition is thermally cured, polymerization of the polyphenylene ether resin (B) and the acrylic compound (A) forms a macromolecule. That is to say, the polyphenylene ether resin (B) is incorporated into the skeleton of the macromolecule. This allows the cured product of the encapsulation resin composition to have excellent heat resistance and moisture resistance.

In this embodiment, the acrylic compound (A) herein refers to a compound having a (meth)acryloyl group. That is to say, the acrylic compound (A) is a compound having at least one of an acryloyl group or a methacryloyl group. The acrylic compound (A) may contain at least one of a monomer or an oligomer.

The encapsulation resin composition containing the acrylic compound (A) reduces the chances of producing voids in the encapsulant 41 made from the encapsulation resin composition. This is because causing the encapsulation resin composition to increase its viscosity during an initial stage in which the acrylic compound (A) is cured by radical polymerization reaction reduces the chances of producing voids inside.

To ensure sufficient heat resistance for the encapsulant 41, the acrylic compound (A) suitably includes a compound having two or more (meth)acryloyl groups per molecule, more suitably includes a compound having two to six (meth)acryloyl groups per molecule, and even more suitably includes a compound having two (meth)acryloyl groups per molecule.

Examples of compounds having two (meth)acryloyl groups per molecule include ethylene glycol di(meth)acrylate, 1,4-butanediol di(meth)acrylate, 1,6-hexanediol di(meth)acrylate, 1,9-nonanediol di(meth)acrylate, 1,3-butanediol di(meth)acrylate, neopentyl glycol di(meth)acrylate, dimer diol di(meth)acrylate, dimethylol tricyclodecane di(meth)acrylate, diethylene glycol di(meth)acrylate, triethylene glycol di(meth)acrylate, tetraethylene glycol di(meth)acrylate, polyethylene glycol di(meth)acrylate, tripropylene glycol di(meth)acrylate, polypropylene glycol di(meth)acrylate, glycerin di(meth)acrylate, trimethylolpropane di(meth)acrylate, pentaerythritol di(meth)acrylate, zinc di(meth)acrylate, cyclohexanediol di(meth)acrylate, cyclohexanedimethanol di(meth)acrylate, cyclohexanediethanol di(meth)acrylate, cyclohexanedialkyl alcohol di(meth)acrylate, and dimethanol tricyclodecane di(meth)acrylate.

Examples of compounds having two (meth)acryloyl groups per molecule include: a reactant of 1 mole of bisphenol A, bisphenol F or bisphenol AD and 2 moles of glycidyl acrylate; and a reactant of 1 mole of bisphenol A, bisphenol F or bisphenol AD and 2 moles of glycidyl methacrylate.

Examples of the compounds having two or more (meth)acryloyl groups per molecule include a (meth)acrylate having a crosslinked polycyclic structure. Specifically, examples of the compounds having two or more (meth)acryloyl groups per molecule include a compound expressed by the following Formula (I) and a compound expressed by the following Formula (II). When the encapsulation resin composition contains at least one of the compound expressed by the following Formula (I) or the compound expressed by the following Formula (II), the heat resistance of the encapsulant 41 improves significantly.

[Chemical Formula 1]

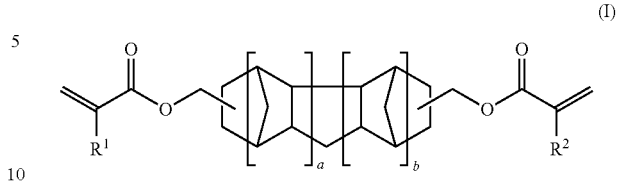

(I)

In Formula (I), $R^1$ and $R^2$ are a hydrogen atom or a methyl group independently of each other, a is 1 or 2, and b is 0 or 1.

[Chemical Formula 2]

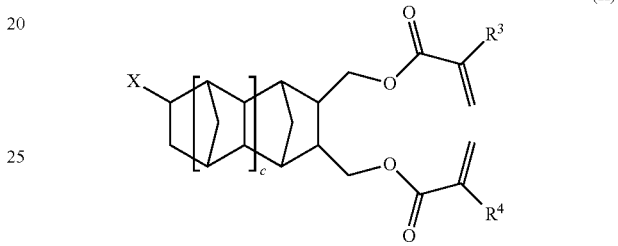

(II)

In Formula (II), $R^3$ and $R^4$ are a hydrogen atom or a methyl group independently of each other, X is a hydrogen atom, a methyl group, a methylol group, an amino group, or a (meth)acryloyloxy methyl group, and c is 0 or 1.

More specific examples of the (meth)acrylate having a crosslinked polycyclic structure include: a (meth)acrylate having a dicyclopentadiene skeleton in which a is 1 and b is 0 in Formula (I); a (meth)acrylate having a perhydro-1,4:5,8-dimethanonaphthalene skeleton in which c is 1 in Formula (II); a (meth)acrylate having a norbornane skeleton in which c is 0 in Formula (II); dicyclopentadienyl diacrylate (tricyclodecane dimethanol diacrylate) in which $R^1$ and $R^2$ are hydrogen atoms, a=1, and b=0 in Formula (I); perhydro-1,4:5,8-dimethanonaphthalene-2,3,7-trimethylol triacrylate in which X is an acryloyloxymethyl group, $R^3$ and $R^4$ are hydrogen atoms, and c is 1 in Formula (II); norbornane dimethylol diacrylate in which X, $R^3$, and $R^4$ are hydrogen atoms and c is 0 in Formula (II); and perhydro-1,4:5,8-dimethanonaphthalene-2,3-dimethylol diacrylate in which X, $R^3$, and $R^4$ are hydrogen atoms, and c is 1 in Formula (II). Among other things, the (meth)acrylate having a crosslinked polycyclic structure suitably includes at least one of dicyclopentadienyl diacrylate or norbornane dimethylol diacrylate.

Examples of the compounds having two or more (meth) acryloyl groups include a di(meth)acrylate having a structure in which an alkylene oxide is added to a bisphenol skeleton. More specific examples of the compounds having two or more (meth)acryloyl groups include a compound expressed by the following Formula (III) and a compound expressed by the following Formula (IV). When the acrylic compound (A) contains at least one of the compound expressed by Formula (III) or the compound expressed by Formula (IV), the adhesion between the encapsulant 41 and the semiconductor chip 3 and the base member 2 increases.

[Chemical Formula 3]

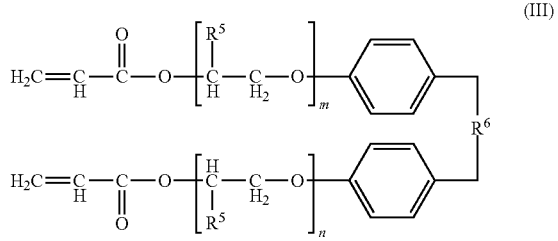

(III)

In Formula (III), $R^5$ represents hydrogen, a methyl group, or an ethyl group, $R^6$ represents a divalent organic group, and m and n each represent an integer falling within the range from 1 to 20.

[Chemical Formula 4]

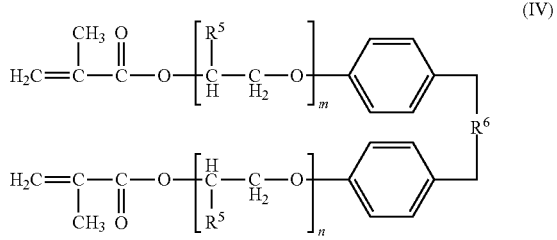

(IV)

[Chemical Formula 5]

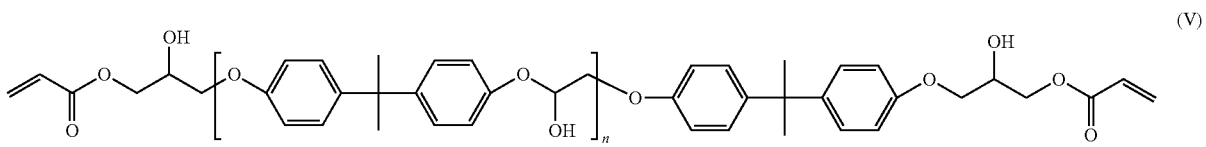

(V)

In Formula (IV), $R^5$ represents hydrogen, a methyl group, or an ethyl group, $R^6$ represents a divalent organic group, and m and n each represent an integer falling within the range from 1 to 20.

More specific examples of the di(meth)acrylate having a structure in which alkylene oxide is added to the bisphenol skeleton include: EO modified bisphenol A type di(meth) acrylate (where n=2 to 20) such as Aronix M-210, M-211B (manufactured by Toagosei Co., Ltd.), NK ester ABE-300, A-BPE-4, A-BPE-6, A-BPE-10, A-BPE-20, A-BPE-30, BPE-100, BPE-200, BPE-500, BPE-900, and BPE-1300N (manufactured by Shin-Nakamura Chemical Co., Ltd.); Aronix M-208 (manufactured by Toagosei Co., Ltd.) and other EO modified bisphenol F type di(meth)acrylates (where n=2 to 20); PO-modified bisphenol A-type di(meth) acrylates (where n=2 to 20) such as Denacol Acrylate DA-250 (manufactured by Nagase ChemteX Corporation) and Viscoat 540 (manufactured by Osaka Organic Chemical Industry Ltd.); and PO-modified phthalic acid diacrylates such as Denacol acrylate DA-721 (manufactured by Nagase ChemteX Corporation).

The compound having two or more (meth)acryloyl groups suitably contains an epoxy (meth)acrylate. That is, the acrylic compound (A) suitably contains an epoxy (meth) acrylate. In this case, particularly when the encapsulation resin composition contains an epoxy resin, not only the reactivity of the encapsulation resin composition but also the heat resistance and adhesion of the encapsulant 41 both improve.

The epoxy (meth)acrylate may be an oligomer which is an additional reactant of an epoxy resin and an unsaturated monobasic acid such as acrylic acid or methacrylic acid.

The epoxy resin which is a material for the epoxy (meth) acrylate includes, for example, a diglycidyl compound (bisphenol type epoxy resin) obtained by condensation of bisphenols represented by bisphenols such as bisphenol A and bisphenol F and epihalohydrin. The epoxy resin may include an epoxy resin having a phenol skeleton. Examples of the epoxy resin having a phenol skeleton include a polyvalent glycidyl ether (a phenol novolac type epoxy resin or a cresol novolac type epoxy resin) obtained by condensation of a phenol novolac, which is a condensate of phenol or cresol and an aldehyde such as formalin, and epihalohydrin. Examples of the epoxy resin may also include an epoxy resin having a cyclohexyl ring.

The epoxy (meth)acrylate suitably includes, for example, a bisphenol A type epoxy acrylate which assumes, at 25° C., the phase of either solid or liquid having a viscosity of 10 Pa·s or more. The bisphenol A type epoxy acrylate may be expressed by, for example, the following Formula (V):

In Formula (V), n represents a positive integer.

Examples of commercially available bisphenol A type epoxy acrylates include Denacol Acrylate DA-250 (manufactured by Nagase ChemteX Corporation and having a melt viscosity of 60 Pa·s at 25° C.), Denacol Acrylate DA-721 (manufactured by Nagase ChemteX Corporation and having a melt viscosity of 100 Pa·s at 25° C.), Ripoxy VR-60 (which is manufactured by Showa High Polymer Co., Ltd. and which is solid at an ordinary temperature) and Ripoxy VR-77 (manufacturing by Showa High Polymer Co., Ltd. and having a melt viscosity of 100 Pa·s at 25° C.).

When the acrylic compound (A) includes a compound having three or more (meth)acryloyl groups, examples of the compounds having three or more (meth)acryloyl groups include pentaerythritol triacrylate, pentaerythritol tetraacrylate, pentaerythritol pentaacrylate, ethoxylated (3) trimethylolpropane triacrylate, ethoxylated (6) trimethylolpropane triacrylate, ethoxylated (9) trimethylolpropane triacrylate, propoxylated (6) trimethylolpropane triacrylate, propoxylated (3) glyceryl triacrylate, highly propoxylated (55) glyceryl triacrylate, ethoxylated (15) trimethylolpropane triacrylate, trimethylolpropane trimethacrylate, tetraethylene glycol diacrylate, dimethylolpropane tetraacrylate, tripropylene glycol diacrylate, pentaacrylate ester, 1,3-adamantane diol dimethacrylate, 1,3-adamantane diol diacrylate, 1,3-adamantane dimethanol dimethacrylate, and 1,3-adamantane dimethanol diacrylate.

The acrylic compound (A) may contain, for example, the (meth)acrylate having a crosslinked polycyclic structure in a proportion of 10% by mass to 50% by mass relative to the entire acrylic compound (A). The acrylic compound (A) also contains the di(meth)acrylate having a structure in which alkylene oxide is added to the bisphenol skeleton in a proportion of 3% by mass to 20% by mass relative to the entire acrylic compound (A). In addition, the acrylic compound (A) may further contain an epoxy (meth)acrylate in a proportion of 5% by mass to 30% by mass relative to the entire acrylic compound (A).

The acrylic compound (A) may contain any of various vinyl monomers other than the above components. For example, the acrylic compound (A) may contain a monofunctional vinyl monomer.

The content of the acrylic compound (A) may account for 40 parts by mass or more and 90 parts by mass or less, and suitably accounts for 30 parts by mass or more and 80 parts by mass or less, relative to 100 parts by mass of the acrylic compound (A), polyphenylene ether resin (B), and the thermoplastic resin combined.

The polyphenylene ether resin (B) will be described. As described above, the polyphenylene ether resin (B) has a radically polymerizable substituent (b1) at a terminal thereof. The polyphenylene ether resin (B) has, for example, a polyphenylene ether chain (b2) and a substituent (b1) bonded to the terminal of the polyphenylene ether chain (b2).

The substituent (b1) may have any structure without limitation as long as the substituent (b1) is radically polymerizable. Examples of the substituent (b1) include a group with a carbon-carbon double bond.

The substituent (b1) is suitably a group having a carbon-carbon double bond. In this case, allowing the substituent (b1) to react with the acrylic compound (A) causes the polyphenylene ether resin (B) to be incorporated into the skeleton of the macromolecule. As a result, the cured product of the encapsulation resin composition comes to have excellent heat resistance and moisture resistance.

The substituent (b1) may have, for example, the structure expressed by the following Formula (1) or the structure expressed by the following Formula (2):

[Chemical Formula 6]

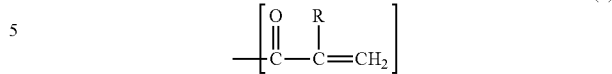

In Formula (1), R is hydrogen or an alkyl group. When R is an alkyl group, the alkyl group is suitably a methyl group.

[Chemical Formula 7]

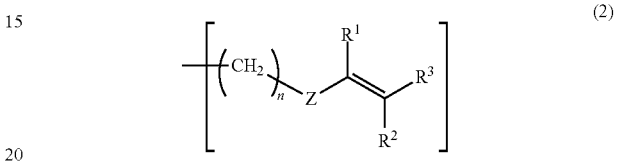

In Formula (2), n is an integer falling within the range from 0 to 10, and n=1, for example. In Formula (2), Z is an arylene group, and $R^1$ to $R^3$ are hydrogen or an alkyl group independently of each other. When n in Formula (2) is 0, Z is directly bonded to the terminal of the polyphenylene ether chain (c1) in the polyphenylene ether resin (C).

The substituent (b1) suitably has the structure expressed by Formula (1), in particular.

The polyphenylene ether resin (B) may contain, for example, a compound having the structure expressed by the following Formula (3):

[Chemical Formula 8]

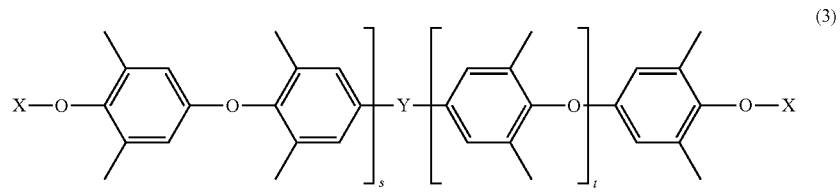

In Formula (3), Y is an alkylene group having 1 to 3 carbon atoms or a direct bond. Y may be a dimethylmethylene group, for example. In Formula (3), X is a substituent (b1) and may be, for example, a group having the structure expressed by Formula (1) or a group having the structure expressed by Formula (2). It is particularly recommended that X be a group having the structure expressed by Formula (1). In Formula (3), s is a number equal to or greater than zero, t is a number equal to or greater than zero, and the sum of s and t is a number equal to or greater than one. In Formula (3), s is suitably a number falling within the range from 0 to 20, t is suitably a number falling within the range from 0 to 20, and the sum of s and t is suitably a number falling within the range from 1 to 30.

The content of the polyphenylene ether resin (B) suitably falls within the range from 20% by mass to 80% by mass relative to 100 parts by mass of the acrylic resin, the polyphenylene ether, and the thermoplastic resin combined. If this content is 20% by mass or more, the cured product of the encapsulation resin composition may have higher heat resistance. If this content is 80% by mass or less, the cured product may have higher flexibility. This content more suitably falls within the range from 25% by mass to 50% by mass.

The encapsulation resin composition may further contain a thermosetting compound other than the acrylic compound (A) and the polyphenylene ether resin (B). Examples of such thermosetting compounds include compounds that cause a thermosetting reaction with the acrylic compound (A). Specific examples of such thermosetting compounds include a bismaleimide resin.

The encapsulation resin composition may contain an elastomer. Examples of the elastomers include maleic anhydride adducts of isoprene polymers.

The encapsulation resin composition may contain a small amount of a thermoplastic resin. Examples of the thermoplastic resin include a copolymer of methyl methacrylate and n-butyl methacrylate.

The thermal radical polymerization initiator (C) contains, for example, an organic peroxide. The one-minute half-life temperature of the organic peroxide suitably falls within the range from 100° C. to 195° C., and more suitably falls within the range from 120° C. to 180° C. In this case, increasing the viscosity of the encapsulation resin composition quickly enough not to impair the wettability between the bump electrodes 31 and the conductor wiring 21 in the initial stage of the step of heating and curing the encapsulation resin composition reduces the number of voids produced. Further, advancing the curing reaction of the encapsulation resin composition sufficiently rapidly allows peeling between the semiconductor chip 3 and the encapsulant 41 to be reduced.

Specific examples of the organic peroxide include t-butyl peroxy-2-ethylhexyl monocarbonate (with a one minute half-life temperature of 161.4° C.), t-butyl peroxy benzoate (with a one-minute half-life temperature of 166.8° C.), t-butyl cumyl peroxide (with a one minute half-life temperature of 173.3° C.), dicumyl peroxide (with a one minute half-life temperature of 175.2° C.), α, α'-di (t-butylperoxy) diisopropylbenzene (with a one minute half-life temperature of 175.4° C.), 2,5-dimethyl-2,5-di(t-butylperoxy)hexane (with a one minute half-life temperature of 179.8° C.), di-t-butylperoxide (with a one minute half-life temperature of 185.9° C.), and 2,5-dimethyl-2,5-bis(t-butylperoxy) hexine (with a one minute half-life temperature of 194.3° C.).

The content of the thermal radical polymerization initiator (C) suitably falls within the range from 0.25 parts by mass to 2.0 parts by mass relative to 100 parts by mass of the acrylic compound and the polyphenylene ether resin (B) combined. This imparts good physical properties to the cured product. The content of the thermal radical polymerization initiator (C) more suitably falls within the range from 0.5 part by mass to 1.5 parts by mass.

In this embodiment, it is also recommended that the encapsulation resin composition further contain an inorganic filler as Component (D) (hereinafter simply referred to as an "inorganic filler (D)"). The encapsulation resin composition containing the inorganic filler (D) further reduces the number of voids produced in the encapsulant 41 when the gap between the base member 2 and the semiconductor chip 3 is sealed by applying ultrasonic vibrations to the encapsulation resin composition while heating the encapsulation resin composition. In addition, this further reduces the chances of the encapsulant 41 peeling off either the base member 2 or the semiconductor chip 3. On top of that, the inorganic filler (D) allows the coefficient of thermal expansion of the encapsulant 41 made of the cured product of the encapsulation resin composition to be controlled. Furthermore, the inorganic filler (D) increases the thermal conductivity of the encapsulant 41, thus allowing the heat generated from the semiconductor chip 3 to be efficiently dissipated via the encapsulant 41.

Examples of the inorganic filler (D) may contain at least one material selected from the group consisting of: silica powders such as fused silica, synthetic silica, and crystalline silica; oxides such as alumina and titanium oxide; silicates such as talc, calcined clay, uncalcined clay, mica and glass; carbonates such as calcium carbonate, magnesium carbonate, and hydrotalcite; hydroxides such as aluminum hydroxide, magnesium hydroxide, and calcium hydroxide; sulfates or sulfites such as barium sulfate, calcium sulfate, and calcium sulfite; borates such as zinc borate, barium metaborate, aluminum borate, calcium borate and sodium borate; and nitrides such as aluminum nitride, boron nitride and silicon nitride. The fused silica may be either fused spherical silica or fused crushed silica. The inorganic filler (D) particularly suitably contains at least one of silica or alumina.

The inorganic filler (D) may have a crushed, needlelike, scaled, spherical, or any other appropriate shape without limitation. To increase the dispersibility of the inorganic filler (D) in the encapsulation resin composition and to control the viscosity of the encapsulation resin composition, the inorganic filler (D) suitably has a spherical shape.

The inorganic filler (D) suitably has a mean particle size smaller than the gap distance between the base member 2 and the semiconductor chip 3 bonded onto the base member 2.

To increase the fill density of the inorganic filler (D) in the encapsulation resin composition and the encapsulant 41 and to control the viscosity of the encapsulation resin composition, the inorganic filler (D) suitably has a mean particle size of 5 µm or less, more suitably 1 µm or less, even more suitably 0.5 µm or less, and particularly suitably falls within the range from 0.1 µm to 0.3 µm.

Note that in this embodiment, the mean particle size is a median diameter calculated based on the result of particle size distribution measurement by laser beam diffraction.

To control the viscosity of the encapsulation resin composition and control the physical properties of the encapsulant 41, the inorganic filler (D) may contain two or more types of components with mutually different mean particle sizes.

The content of the inorganic filler (D) may account for, for example, 10% by mass or more and 90% by mass or less relative to the solid content of the encapsulation resin composition.

The encapsulation resin composition may contain a flux. Examples of the fluxes include an organic acid. When the encapsulation resin composition contains an organic acid, the action of the organic acid allows a surface oxide film to be removed from the bump electrodes 31 during the reflow process, thus ensuring good reliability of connection between the semiconductor chip 3 and the base member 2. The organic acid may contain at least one compound selected from the group consisting of sebacic acid, abietic acid, glutaric acid, succinic acid, malonic acid, oxalic acid, adipic acid, pimelic acid, suberic acid, azelaic acid, diglycolic acid, thiodiglycolic acid, phthalic acid, isophthalic acid, terephthalic acid, propanetricarboxylic acid, citric acid, benzoic acid, and tartaric acid. The content of the organic acid suitably accounts for 0.1% by mass or more and 20% by mass or less, and more suitably 0.1% by mass or more and 10% by mass or less, relative to the solid content of the encapsulation resin composition.

The encapsulation resin composition may contain maleic acid-modified polybutadiene. The encapsulation resin composition containing the maleic acid-modified polybutadiene increases the adhesion between the encapsulant 41 and the base member 2 particularly significantly. The content of the maleic acid-modified polybutadiene suitably accounts for 10% by mass or more and 30% by mass or less of the acrylic compound (A).

The encapsulation resin composition may further contain known constituting components of resin such as epoxy compounds and phenolic compounds. Examples of the epoxy compounds include at least one component selected from the group consisting of: alkylphenol novolac type epoxy resins such as phenol novolac type epoxy resins and cresol novolac type epoxy resins; naphthol novolac type epoxy resins; phenol aralkyl type epoxy resins having a phenylene skeleton, a biphenylene skeleton, or any other skeleton; biphenyl aralkyl type epoxy resins; naphthol aralkyl type epoxy resins having a phenylene skeleton, a biphenylene skeleton, or any other skeleton; polyfunctional epoxy resins such as triphenolmethane type epoxy resin and alkyl modified triphenolmethane type epoxy resin; triphenylmethane type epoxy resins; tetrakisphenolethane type epoxy resins; dicyclopentadiene type epoxy resins; stilbene type epoxy resins; bisphenol-type epoxy resins such as bisphenol A type epoxy resins and bisphenol F type epoxy resins; biphenyl-type epoxy resins; naphthalene-type epoxy resins; alicyclic epoxy resins; brome-containing epoxy resins such as bisphenol A-type brome-containing epoxy resin; glycidyl amine type epoxy resins obtained by reaction of polyamine such as diaminodiphenylmethane or isocyanuric acid and epichlorohydrin; and glycidyl ester type epoxy resins obtained by reaction of a polybasic acid such as phthalic acid or dimer acid with epichlorohydrin. Examples of the phenolic compounds include at least one component selected from the group consisting of: phenolic resins, more specifically, novolac type resins such as phenol novolac resins, cresol novolac resins and naphthol novolac resins; dicyclopentadiene type phenol novolac resins, dicyclopentadiene type naphthol novolac resins and other dicyclopentadiene type phenolic resins; terpene modified phenolic resins; bisphenol type resins such as bisphenol A and bisphenol F; and triazine modified novolac resins. When the encapsulation resin composition contains an epoxy compound, the encapsulation resin composition may further contain a curing accelerator that accelerates curing of the epoxy compound.

The encapsulation resin composition may contain a radical scavenger as long as the advantages of this embodiment are not reduced. That is to say, the encapsulation resin composition may or may not contain a radical scavenger. If the encapsulation resin composition contains a radical scavenger, even radicals generated in the encapsulation resin composition when the encapsulation resin composition is heated may be scavenged by the radical scavenger. This slows down the advancement of the thermal radical reaction in the encapsulation resin composition, thus reducing the thermal radical reaction when the encapsulation resin composition is heated and melted. This allows the reactivity of the encapsulation resin composition being heated to be controlled, thus making the viscosity of the encapsulation resin composition controllable.

Examples of radical scavengers include nitroxide compounds and carbonylthio compounds. The encapsulation resin composition containing a nitroxide compound allows, when the encapsulation resin composition is melted by heating, the advancement of the initial thermal radical reaction to be slowed down moderately.

Examples of nitroxide compounds include at least one component selected from the group consisting of: 2,2,6,6-tetramethyl-1-piperidineoxy free radical (TEMPO); 4-acetamido-2,2,6,6-tetraethylpiperidine-1-oxy free radical; 4-amino-2,2,6,6-tetramethylpiperidine-1-oxy free radical; 4-carboxy-2,2,6,6-tetramethylpiperidine-1-oxy free radical; 4-oxo-2,2,6,6-tetramethylpiperidine-1-oxy free radical; 4-methacryloyloxy-2,2,6,6-tetramethyl piperidine-1-oxy free radical; and [[N, N'-[adamantan-2-ylidene bis(1,4-phenylene)] bis (tert-butylamine)]-N, N'-diylbisoxy] radical. The content of the nitroxide compound suitably accounts for 2.5% by mass or more and 20% by mass or less with respect to the thermal radical polymerization initiator (C).

The encapsulation resin composition may contain additives other than the components described above as long as the advantages of this embodiment are not reduced. Examples of additives include silane coupling agents, defoamers, leveling agents, low stress agents, and pigments.

The encapsulation resin composition may be prepared by the following method, for example.

First, all components, but the inorganic filler (D), of the encapsulation resin composition described above are compounded together either simultaneously or sequentially to obtain a mixture. This mixture is then stirred up and blended while being subjected to heating or cooling treatment as needed. Next, the inorganic filler (D) is added to the mixture depending on the necessity. Subsequently, the mixture is once again stirred up and blended while being subjected to heating or cooling treatment as needed. In this manner, the encapsulation resin composition may be obtained. To stir up the mixture, a disper, a planetary mixer, a ball mill, a three-roll mill, a bead mill and other mixers may be used in combination as needed, for example.

It is also recommended that the encapsulation resin composition be formed into a sheet shape. In other words, the encapsulation resin composition suitably has a sheet shape. The encapsulation resin composition is suitable to making the encapsulant 41 of the semiconductor device 1 (see FIG. 1).

An encapsulation resin composition in a sheet shape (hereinafter referred to as a "sheet member 40") and a laminated sheet 6 including the sheet member 40 will be described in detail with reference to FIG. 2.

In making the sheet member 40, first, a composition in liquid phase is prepared by adding, as needed, a solvent to the components of the encapsulation resin composition, for example. Examples of the solvent include at least one component selected from the group consisting of methanol, ethanol, ethylene glycol monomethyl ether, ethylene glycol monoethyl ether, ethylene glycol monobutyl ether, methyl ethyl ketone, acetone, isopropylacetone, toluene, and xylene. The amount of the solvent to add may be set appropriately. For example, the content of the solvent may account for 20% by mass or more and 80% by mass or less with respect to the entire solid content of the encapsulation resin composition. Note that the solvent is vaporizable when the sheet member is obtained by forming the encapsulation resin composition into a sheet shape.

In addition, a supporting sheet 60 is provided. The supporting sheet 60 may include an appropriate plastic sheet 61 of polyethylene terephthalate, for example. Optionally, the supporting sheet 60 may include the plastic sheet 61 and an adhesive layer 62 stacked on the plastic sheet 61. The adhesive layer 62 is a layer with a moderate degree of adhesive force and may be used to secure the supporting sheet 60 onto an appropriate base. The adhesive layer 62 may have reaction curability. In that case, the supporting sheet 60 may be firmly secured to an appropriate base by allowing the adhesive layer 62 to cure after the supporting sheet 60 has been placed on the base. The adhesive layer 62 may be made from an acrylic resin, synthetic rubber, natural rubber, or a polyimide resin, for example.

The liquid composition is applied onto one surface of the supporting sheet 60. If the supporting sheet 60 includes the plastic sheet 61 and the adhesive layer 62, then the liquid composition is applied onto a surface, opposite from the adhesive layer 62, of the plastic sheet 61. Subsequently, the liquid composition is dried or semi-cured by heating the liquid composition on the supporting sheet 60. In this case, the liquid composition is suitably heated under the condition including a heating temperature of 60° C. to 120° C. and a heating duration of 5 to 30 minutes. This allows the sheet member 40 to be formed on the supporting sheet 60 and a laminated sheet 6 including the sheet member 40 and the supporting sheet 60 to support the sheet member 40 to be obtained. The encapsulation resin composition containing the polyphenylene ether resin (B) facilitates forming the encapsulation resin composition into a sheet shape, thus making it particularly easy to make the sheet member 40.

The sheet member 40 may have a thickness falling within the range from 10 μm to 50 μm, for example. However, this is only an example and should not be construed as limiting. Alternatively, the sheet member 40 may have any other appropriate thickness to be selected according to the thickness of the encapsulant 41 of the semiconductor device 1.

Figure 2:
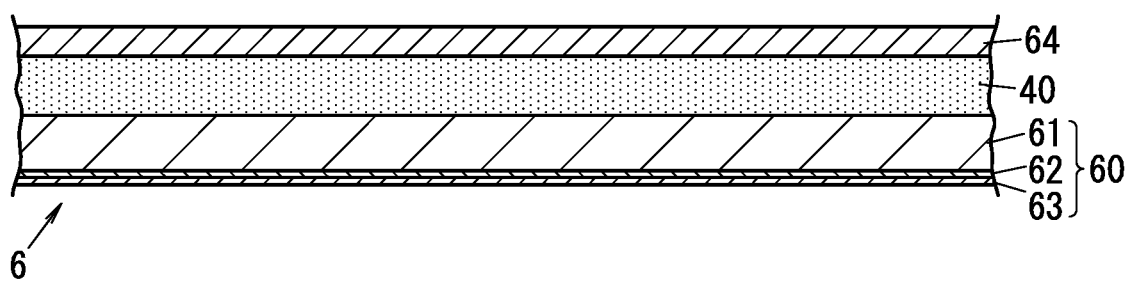
FIG. 2 is a schematic cross-sectional view illustrating a laminated sheet according to an exemplary embodiment of the present invention.

Optionally, the laminated sheet 6 may further include a protective film 64 that coats the sheet member 40 as shown in FIG. 2. The material for the protective film 64 is not particularly limited. Also, if the supporting sheet 60 includes the adhesive layer 62, then laminated sheet 6 may further include a coating sheet 63 that coats the adhesive layer 62 as shown in FIG. 2. The material for the coating sheet 63 is not particularly limited, either.

A cured product is obtained by thermally curing the encapsulation resin composition. The cured product of the encapsulation resin composition is suitably used as an encapsulant that hermetically seals the gap between the base member 2 and the semiconductor chip 3 bonded onto the base member 2. The encapsulation resin composition placed in the gap between the base member 2 and the semiconductor chip 3 is heated and subjected to ultrasonic vibrations. Thus, even when the encapsulant 41 is made from the encapsulation resin composition by curing, the number of voids produced in the encapsulant 41 is still reducible.

The glass transition temperature of the cured product is suitably equal to or higher than 100° C. and more suitably equal to or higher than 150° C. In that case, the cured product may have high heat resistance, and therefore, the semiconductor device 1 including the encapsulant 41 made of the cured product may have an excellent degree of heat resistance reliability. When the encapsulation resin composition contains the polyphenylene ether resin (B), such a glass transition temperature is easily achievable by appropriately controlling the composition of the encapsulation resin composition.

The encapsulation resin composition is effectively usable as an underfilling material. A semiconductor device 1 may be fabricated by hermetically sealing, with this encapsulation resin composition, the gap between the base member 2 and the semiconductor chip 3 by pre-applied underfilling.

FIG. 1A illustrates an example of the semiconductor device 1. This semiconductor device 1 includes a base member 2, a semiconductor chip 3 bonded facedown onto the base member 2, and an encapsulant 41 that hermetically seals the gap between the base member 2 and the semiconductor chip 3. The encapsulant 41 is a cured product of an encapsulation resin composition. The semiconductor chip 3 includes bump electrodes 31 on its surface facing the base member 2. Meanwhile, the base member 2 has conductor wiring 21 on its surface facing the semiconductor chip 3. The bump electrodes 31 and the conductor wiring 21 are aligned with each other and connected together via solder bumps 32. These bump electrodes 31 and the conductor wiring 21 are embedded in the encapsulant 41.

A method for fabricating the semiconductor device 1 according to this embodiment includes providing a base member 2 having conductor wiring 21, an encapsulation resin composition, and a semiconductor chip 3 with bump electrodes 31. The method further includes: arranging the semiconductor chip 3 having the bump electrodes 31 on one surface, having the conductor wiring 21, of the base member 2 with the encapsulation resin composition interposed between the semiconductor chip 3 and the base member 2 such that the conductor wiring 21 faces the bump electrodes 31. The method further includes applying, in this state, ultrasonic vibrations to the encapsulation resin composition while heating the encapsulation resin composition to hermetically seal the gap between the base member 2 and the semiconductor chip 3 and electrically connect the conductor wiring 21 to the bump electrodes 31. In this manner, a semiconductor device 1, in which the gap between the base member 2 and the semiconductor chip 3 is sealed with the encapsulant 41 with a reduced number of voids, may be fabricated.

Next, an exemplary method for fabricating the semiconductor device 1 will be described in further detail with reference to FIGS. 3A-3D.

First, a base member 2, a semiconductor chip 3, and an encapsulation resin composition are provided.

The base member 2 may be a motherboard, a package board, or an interposer board, for example. In this embodiment, the base member 2 includes an insulating substrate made of glass epoxy, polyimide, polyester, a ceramic, or any other suitable material and conductor wiring 21 made of an electrical conductor such as copper and formed on its surface.

The semiconductor chip 3 includes bump electrodes 31 which are electrically connected to a circuit that has been formed on one surface of a silicon wafer by an appropriate method such as a photolithographic process. In this embodiment, the bump electrodes 31 of the semiconductor chip 3 include solder bumps 32. Alternatively, not the bump electrodes 31 but the conductor wiring 21 on the base member 2 may include the solder bumps 32. Still alternatively, each of the bump electrodes 31 and the conductor wiring 21 may include the solder bumps 32. In other words, at least one of the bump electrodes 31 of the semiconductor wafer or the conductor wiring 21 of the base member 2 may include the solder bumps 32. The solder bumps 32 are suitably made of lead-free solder having a melting point of 210° C. or more such as Sn-3.5Ag (with a melting point of 221° C.), Sn-2.5Ag-0.5Cu-1Bi (with a melting point of 214° C.), Sn-0.7Cu (with a melting point of 227° C.), or Sn-3Ag-0.5Cu (with a melting point of 217° C.).

The semiconductor chip 3 may be formed out of an individual sheet that has been cut to appropriate dimensions out of a stack of the laminated sheet 6 and a semiconductor wafer. Specifically, the individual sheet may be obtained in the following manner. First, the sheet member 40 of the laminated sheet 6 may be laid over the surface, having the bump electrodes 31, of the semiconductor wafer, for example. In this case, after the protective film 64 has been stripped from the sheet member 40 of the laminated sheet 6, the sheet member 40 laid on top of the supporting sheet 60 is further laid over the surface, having the bump electrodes 31, of the semiconductor wafer. Next, the semiconductor wafer is diced by cutting off the semiconductor wafer with the sheet member 40 still attached thereto. In this case, after the coating sheet 63 has been stripped from the adhesive layer 62 of the supporting sheet 60, the adhesive layer 62 may be placed on a base and then allowed to cure as needed, for example. In this manner, the supporting sheet 60 is fixed on the base with the sheet member 40 laid on top of the supporting sheet 60. In this state, the semiconductor wafer is cut off with the sheet member 40 still attached thereto. As a result, a plurality of members, each including a semiconductor chip 3 that has been cut out of the semiconductor wafer and an individual sheet that has been cut out of the sheet member 40 (hereinafter referred to as a "chip member"), are obtained. Then, each chip member is removed from its supporting sheet 60. In each chip member, the semiconductor chip 3 thereof includes the bump electrodes 31 and the individual sheet is laid over the surface, having the bump electrodes 31, of the semiconductor chip 3.

Next, the semiconductor chip 3 is bonded facedown onto the base member 2 with the encapsulation resin composition interposed between the base member 2 and the semiconductor chip 3. In this embodiment, the bonding process is carried out in the following manner using a flip-chip bonder 70 including a bonding head 71 and a stage 72 and having the capability of applying ultrasonic vibrations as shown in FIG. 3A. Note that in this embodiment, the flip-chip bonder 70 is configured such that the bonding head 71 thereof is able to apply ultrasonic vibrations. However, this is only an example and should not be construed as limiting. Alternatively, the flip-chip bonder 70 may have any other configuration as long as the flip-chip bonder 70 is able to apply ultrasonic vibrations to the encapsulation resin composition. For example, the stage 72 may have the capability of applying ultrasonic vibrations. Specific examples of the flip-chip bonder 70 include FCB3 manufactured by Panasonic Corporation. Also, in FIGS. 3A-3D and in the foregoing description, the encapsulation resin composition is supposed to be stacked in advance on the semiconductor chip 3. However, this is only an example and should not be construed as limiting. Alternatively, with the base member 2 placed on the stage 72 and with the semiconductor chip 3 held by the bonding head 71, the encapsulation resin composition as the sheet member 40 may be interposed between the base member 2 and the semiconductor chip 3, for example. In that case, the encapsulation resin composition may be interposed between the base member 2 and the semiconductor chip 3 by applying the encapsulation resin composition onto the base member 2, for example.

As shown in FIG. 3A, the base member 2 with the conductor wiring 21 is supported by the stage 72, and the semiconductor chip 3 is held by the bonding head 71 such that the bump electrodes 31 of the semiconductor chip 3 face the base member 2 supported on the stage 72. Meanwhile, the encapsulation resin composition is interposed between the base member 2 and the semiconductor chip 3. In this state, the bonding head 71 is moved toward the stage 72 as shown in FIG. 3B. This allows the semiconductor chip 3 to be placed in position over the base member 2 with the encapsulation resin composition interposed between them. At this time, the semiconductor chip 3 is aligned with the base member 2 such that the bump electrodes 31 of the semiconductor chip 3 are laid on top of the conductor wiring 21 of the base member 2.

In this case, ultrasonic vibrations are applied to the encapsulation resin composition, the semiconductor chip 3, and the base member 2 via the bonding head 71 and the stage 72 while the encapsulation resin composition, the semiconductor chip 3, and the base member 2 are being heated, thereby heating the solder bumps 32 and the encapsulation resin composition. The heating temperature may be set appropriately according to either the composition of the solder bumps 32 and the composition of the encapsulation resin composition or the reaction start temperature of the encapsulation resin composition. The heating temperature suitably falls within the range from 100° C. to 150° C. as described above.

The duration of applying the ultrasonic vibrations and the frequency of vibrations may be set appropriately. For example, the ultrasonic vibrations may be applied for a duration falling within the range from 0.1 seconds to 5.0 seconds and the frequency of vibrations may fall within the range from 10 kHz to 80 kHz.

Optionally, when ultrasonic vibrations are applied to the encapsulation resin composition, the semiconductor chip 3, and the base member 2 via the bonding head 71 and the stage 72 while the encapsulation resin composition, the semiconductor chip 3, and the base member 2 are being heated, load may be applied by the bonding head 71 onto the base member 2, the semiconductor chip 3, and the encapsulation resin composition on the stage 72. For example, the bonding head 71 may be configured to apply pressure toward the stage 72. This allows load to be applied by pressing the bonding head 71 against the semiconductor chip 3 with the encapsulation resin composition interposed between the base member 2 and the semiconductor chip 3. The condition for applying the load may be set appropriately in this case. For example, the load applied may fall within the range from 10 N to 200 N.

As can be seen, applying ultrasonic vibrations to the solder bumps 32 and the encapsulation resin composition while heating the solder bumps 32 and the encapsulation resin composition with the encapsulation resin composition interposed between the base member 2 and the semiconductor chip 3 causes the solder bumps 32 to be melted, thus electrically connecting the bump electrodes 31 and the conductor wiring 21 together. In addition, causing the encapsulation resin composition to thermally cure after having been melted once allows the encapsulant 41 to be formed as shown in FIG. 3C. In this manner, the gap between the semiconductor chip 3 and the base member 2 is sealed hermetically with the encapsulant 41.

Figure 3D:
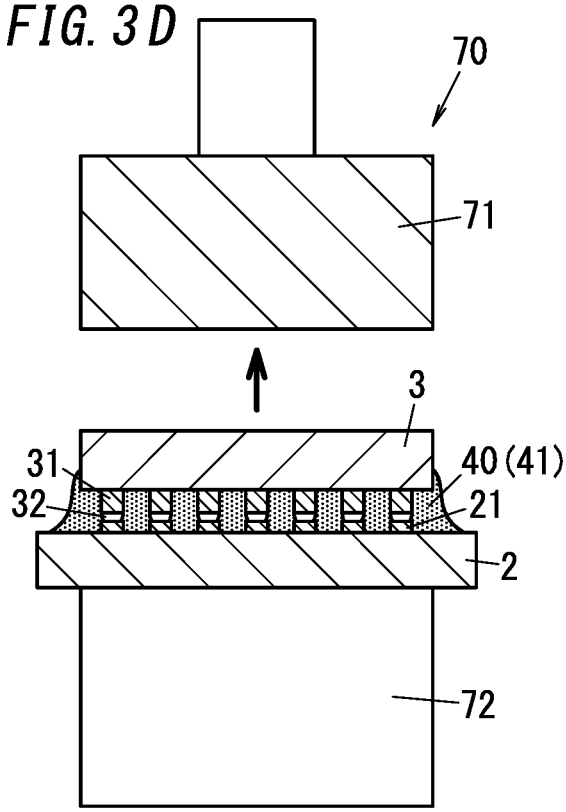

Subsequently, as shown in FIG. 3D, the bonding head 71 is lifted upward and removed from the semiconductor chip 3.

Bonding the semiconductor chip 3 onto the base member 2 in this manner allows the semiconductor device 1 shown in FIG. 1A to be obtained. As can be seen, according to this embodiment, even when the temperature of the bonding head 71 is set at a relatively low temperature, the gap between the base member 2 and the semiconductor chip 3 may still be sealed with the encapsulant 41. In addition, in the encapsulant 41 thus formed out of the encapsulation resin composition, the number of residual voids has been reduced as described above.

Optionally, after the semiconductor device 1 has been fabricated as described above, another semiconductor device 1 may be fabricated in succession using the same flip-chip bonder 70 again. In this embodiment, the encapsulation resin composition has a peculiar viscosity behavior and has low viscosity in a certain temperature range. This facilitates setting the heating temperature at the time of the bonding process, thereby allowing the temperature of the bonding head 71 to be set at a relatively low temperature. That is why even when a plurality of semiconductor devices 1 need to be fabricated in succession by repeating the same process over and over again, the time for cooling the bonding head 71 may be either eliminated or cut down significantly. This would improve the productivity of semiconductor devices 1.

In a variation of this embodiment, the semiconductor device 1 may also be implemented as a semiconductor device 1 with a multi-stage stack structure in which the encapsulant 41 and the semiconductor chips 3 are alternately laid one on top of another in multiple stages on the base member 2 as shown in FIG. 1B. To fabricate a semiconductor device 1 with such a multi-stage stack structure, after the semiconductor chip 3 has been stacked over the base member 2 with the encapsulation 41 made from the encapsulation resin composition interposed between them as in the embodiment described above, another semiconductor chip 3 and another encapsulation resin composition may be heated and subjected to ultrasonic vibrations using the same flip-chip bonder 70 once again such that the latter (additional) semiconductor chip 3 is stacked over the former (already stacked) semiconductor chip 3 with an additional encapsulant 41 interposed between them. Repeating this process over and over again allows a semiconductor device 1 with such a multi-stage stack structure in which the encapsulant 41 and semiconductor chips 3 are alternately stacked one on top of another in this order on the base member 2 to be fabricated. In the exemplary semiconductor device 1 shown in FIG. 1B, the semiconductor chips are stacked one on top of another in four stages. However, the number of the semiconductor chips stacked does not have to be four but may be set as appropriate according to the application, intended use, or any other factor.

According to this variation of the exemplary embodiment, not only the heating temperature may be set at a relatively low temperature, but also the time for cooling the bonding head 71 of the flip-chip bonder 70 may be either eliminated or cut down significantly. This would improve the productivity even when a semiconductor device 1 with such a multi-stage stack structure is fabricated.

EXAMPLES

1. Preparation of Examples 1-5 and Comparative Examples 1-4

Examples 1-5 and Comparative Examples 1-4 of the encapsulation resin composition were prepared in the following manner.

First, respective components shown in the "Composition" column of Table 1 were provided. Among these components, first, the acrylic compounds were weighed and stirred up and blended together with a disper. Subsequently, all components other than the polyphenylene ether resin and inorganic filler were added to, and blended with, this mixture of the acrylic compounds to prepare a first mixture solution. Meanwhile, a second mixture solution was prepared by dissolving the polyphenylene ether resin in methyl ethyl ketone. The first mixture and the inorganic filler were added to the second mixture, and these were stirred up with a disper and then blended together in a beads mill to have the inorganic filler dispersed. In this manner, an encapsulation resin composition was prepared. The concentration of the methyl ethyl ketone in the encapsulation resin composition was adjusted to fall within the range from 30% by mass to 50% by mass.

The details of the components shown in the "Composition" column of Table 1 are as follows:

Modified polybutadiene: maleic acid modified polybutadiene, manufactured by Cray Valley Co., Ltd., product name Ricobond 1756;

Acrylic compound 1: ethoxylated bisphenol A dimethacrylate, manufactured by Shin Nakamura Chemical Co., Ltd., product number BPE-100;

Acrylic compound 2: bisphenol A type epoxy acrylate, Showa High Polymer Co., Ltd., product number VR-77;

Acrylic compound 3: tricyclodecane dimethanol diacrylate, manufactured by Shin Nakamura Chemical Co., Ltd., product number A-DCP;

Acrylic compound 4: trimethylolpropane triacrylate, manufactured by Shin-Nakamura Chemical Co., Ltd., product number A-TMPT;

Polyphenylene ether resin: a modified polyphenylene ether resin manufactured by SABIC under the product number SA9000 and having the structure expressed by Formula (3), in which X is a group (R is a methyl group) having the structure expressed by Formula (1);

Thermal radical polymerization initiator: dicumyl peroxide, manufactured by NOF CORPORATION, product name Percumyl D;

Thermoplastic resin: copolymer of methyl methacrylate and n-butyl methacrylate, manufactured by Evonik Japan, product name DYNACOLL AC2740;

Inorganic filler 1 (filler): silica powder, manufactured by Tokuyama Corporation, product number NMH-24D, mean particle size of 0.24 μm;

Inorganic filler 2 (filler): manufactured by Admatechs, product number SO-C2, mean particle size of 0.5 μm;

Nitroxide compound: 2,2,6,6-tetramethyl-1-piperidineoxy free radical, manufactured by Tokyo Chemical Industry Co., Ltd.;

Silane coupling agent: 3-glycidoxypropyltrimethoxysilane, manufactured by Shin-Etsu Chemical Co., Ltd., product number KBM-403; and Flux: sebacic acid.

2. Evaluation Tests

The encapsulation resin composition was subjected to the following evaluation tests. The results of these evaluation tests are summarized in Table 1.

(1) Measurement of Melt Viscosity and Evaluation of Reaction Start Temperature

The respective examples and comparative examples of the encapsulation resin composition had the temperature dependence of their melt viscosity measured using a rheometer (model number AR2000ex) manufactured by TA Instruments Inc. under the condition including a temperature range of 100-300° C., a temperature rise rate of 60° C./min, and an angular velocity of 0.209 rad/s. In this manner, melt viscosity curves, each showing the relationship between the temperature and melt viscosity of an associated one of the encapsulation resin compositions, were obtained. The reaction start temperature of each encapsulation resin composition was obtained by detecting the lowest melt viscosity from its melt viscosity curve and finding a temperature at a melt viscosity higher by 50 Pa·s than the lowest melt viscosity. In addition, using this reaction start temperature as a reference, the melt viscosity at the reaction start temperature, the highest melt viscosity at temperatures equal to or higher than the temperature lower by 40° C. than the reaction start temperature and equal to or lower than the reaction start temperature, and the melt viscosity at a temperature lower by 50° C. than the reaction start temperature were determined and melt viscosities at a predetermined temperature are shown in their respective predetermined columns of Table 1.

(2) Evaluation of Glass Transition Temperature

A film of polyethylene terephthalate was provided as a supporting sheet. A film of an encapsulation resin composition was deposited on the supporting sheet using a bar-coater so as to have a wet film thickness of 100 μm, and then was heated at 80° C. for 30 minutes. In this manner, a sheet member was formed to a thickness of 50 μm on the supporting sheet. A number of sheet members were stacked one on top of another, compressed with a vacuum laminator, heated by an oven at 150° C. for two hours to be cured, and then cut off, thereby making samples with dimensions 4 mm×40 mm in a plan view and a thickness of 800 mm.

The glass transition temperature of this sample was measured using a thermal mechanical analyzer (TMA) (model number SS7100) manufactured by Seiko Instruments Inc. under the condition including a tensile force of 49 mN and a temperature program of 5° C./min at a temperature of 30° C. to 300° C.

(3) Void Evaluation

A semiconductor device was fabricated in the following manner using an encapsulation resin composition.

Walts TEG IP80 (10 mm×10 mm×300 μm) manufactured by WALTS Co., Ltd. was provided as a base member.

Walts TEG CC80 (7.3 mm×7.3 mm×100 μm) manufactured by WALTS Co., Ltd. was provided as a semiconductor wafer. The semiconductor wafer included 1,048 bump electrodes, each including a Cu pillar with a height of 30 μm and a solder bump stacked thereon and having a height of 15 μm and had a pitch of 80 μm between adjacent solder bumps.

A film of polyethylene terephthalate was provided as the supporting sheet. A film of an encapsulation resin composition was deposited on the supporting sheet using a bar-coater so as to have a wet film thickness of 100 μm, and then was heated at 80° C. for 30 minutes. In this manner, a sheet member was formed to a thickness of 45 to 55 μm on the supporting sheet.

The sheet member was laid on top of the semiconductor wafer, the assembly was fixed onto a dicing frame, and the sheet member was diced, using a dicing saw (product name: DFD6341) manufactured by DISCO Corporation, with the silicon wafer still attached thereto, thereby cutting out a plurality of chip members, each including a semiconductor chip and an individual sheet with the encapsulation resin composition having dimensions of 7.3 mm×7.3 mm×100 μm.

As a flip-chip bonder with the capability of applying ultrasonic vibrations, a flip-chip bonder with the model number FCB3 manufactured by Panasonic Corporation was used. With the stage of the flip-chip bonder heated, the base member was fixed onto the stage. The chip member was held by the bonding head of the flip-chip bonder and the bonding head was heated. In such a state, the bonding head was brought closer toward the stage and the individual sheet of the chip member was laid over the base member with the bump electrodes of the semiconductor chip aligned with the conductor wiring on the base member. The temperature of the stage was set at 145° C. and the temperature of the bonding head was set at 115° C. to make the heating temperature of the encapsulation resin composition 130° C. In this state, ultrasonic vibrations were applied with the flip-chip bonder pressed against the semiconductor chip and with load placed on the semiconductor chip toward the base member. The load was placed under such a condition that a load of 10 N would be placed for 0.1 seconds since the load started to be placed, a load of 50 N would be placed at a point in time when 0.2 seconds passed since the start of placing the load, and a load of 50 N would be kept placing from the point in time when 0.2 seconds passed since the start of placing the load through a point in time when 1.0 second passed since then. The ultrasonic vibrations started to be applied at a point in time when 0.5 seconds passed since the start of placing the load, were applied such that the output would reach 3 W at a point in time when 0.6 seconds passed since the start of placing the load, and had their output maintained at 3 W from the point in time when 0.6 seconds passed since the state of placing the load through a point in time when 1.0 second passed since then. When 1.0 second passed since the start of placing the load, the load stopped being placed and the bonding stage was removed from the stage.

Subsequently, the encapsulation resin composition interposed between the base member and the semiconductor chip was heated at a temperature of 150° C. for one hour to be cured completely, thus obtaining a semiconductor device under test. This semiconductor device 1 was inspected using a scanning acoustic tomograph (SAT) to see if any voids were present in the encapsulant of the semiconductor device. When no voids were detected from the encapsulant, the semiconductor device under test was rated "A." On the other hand, when any voids were detected from the encapsulant, the semiconductor device under test was rated "C."

(4) Evaluation of Connectivity

Using the encapsulation resin composition, a semiconductor device under test was fabricated by the same method as in the case of (3) void evaluation. The connectivity of the semiconductor device was evaluated in the following manner. Specifically, the semiconductor device was cut off, and a cross section thereof exposed was polished. The gap distance between the Cu pillar of the semiconductor chip and the conductor wiring of the base member via the solder bump as exposed on this cross section was measured. When the gap distance turned out to be less than 5 μm, the semiconductor device under test was rated "A." When the gap distance fell within the range from 5 μm to less than 10 μm, the semiconductor device under test was rated "B." When the gap distance turned out to be 10 μm or more, the semiconductor device under test was rated "C."

(5) Evaluation of Peelability

Using the encapsulation resin composition, a semiconductor device under test was fabricated by the same method as in the case of (3) void evaluation. This semiconductor device was inspected using a scanning acoustic tomograph (SAT) to see if any peeling was observed at the interface between the cured product, the semiconductor chip, and the base member. When no peeling was observed, the semiconductor device under test was rated "A." When any peeling was observed, the semiconductor device under test was rated "C."

|  |  | Examples ||||| Comparative Examples ||||
|---|---|---|---|---|---|---|---|---|---|---|
|  |  | 1 | 2 | 3 | 4 | 5 | 1 | 2 | 3 | 4 |
| Composition | Modified polybutadiene | 5.0 | 5.0 | 6.2 | 5.0 | 3.5 | 3.1 | 2.4 | 5.8 | 6.2 |
|  | Acrylic compound 1 | 3.4 | 3.4 | 4.3 | 3.4 | 14.9 | 1.1 | 1.7 | 4.0 | 4.3 |
|  | Acrylic compound 2 | 1.7 | 1.7 | 2.1 | 1.7 | 1.2 | 2.1 | 0.8 | 2.0 | 2.2 |
|  | Acrylic compound 3 | 9.4 | 9.4 | 11.8 | 9.4 | — | 5.8 | 4.6 | 11.0 | 11.9 |
|  | Acrylic compound 4 | 0.5 | 0.5 | 0.6 | 0.5 | — | 0.3 | 0.2 | 0.6 | 0.6 |
|  | Polyphenylene ether resin | 10.0 | 5.0 | 7.5 | 10.0 | 10.0 | 6.2 | 9.8 | 23.3 | 22.4 |
|  | Thermal radical polymerization initiator [phr] | 1.0 | 1.0 | 1.0 | 1.0 | 0.3 | 1.0 | 1.0 | 1.0 | 1.0 |
|  | Thermoplastic resin | 10 | 5.0 | 7.5 | 10.0 | 10.0 | 6.2 | 19.7 | 2.5 | 22.4 |
|  | Inorganic filler 1 (filler) | 60.0 | 70.0 | 60.0 | 60.0 | — | 75.0 | 60.0 | 50.0 | 30.0 |
|  | Inorganic filler 2 (filler) | — | — | — | — | 59.0 | — | — | — | — |
|  | Nitroxide compound | — | — | — | — | — | 0.015 | — | — | — |
|  | Silane coupling agent | 1.0 | 1.0 | 1.0 | 1.0 | 1.0 | 1.0 | 1.0 | 1.0 | 1.0 |
|  | Flux [phr] | 0.75 | 0.75 | 0.75 | — | 0.40 | 0.75 | 0.75 | 0.75 | 0.75 |
|  | Ratio [%] of acrylic to solid content (including filler) | 25 | 25 | 33 | 25 | 25 | 14 | 11 | 31 | 34 |
|  | Liquid content ratio [%] | 20 | 20 | 30 | 20 | 20 | 6.2 | 10 | 25 | 25 |
|  | Solid content ratio (excluding filler) | 20 | 10 | 10 | 20 | 20 | 6.2 | 30 | 25 | 45 |
| Evaluation | Reaction start temperature | 151 | 152 | 154 | 150 | 143 | 182 | 155 | 127 | 146 |
|  | Melt viscosity [Pa·s] at reaction start temperature | 185 | 94 | 134 | 185 | 75 | 200 | 482 | 190 | 63 |
|  | Maximum melt viscosity [Pa·s] at temperature ≥ temperature lower by 40° C. than reaction start temperature and ≤ the reaction start temperature | 373 | 138 | 136 | 360 | 525 | 504 | 7150 | 1250 | 760 |
|  | Melt viscosity [Pa·s] at temperature lower by 50° C. than reaction start temperature | 598 | 165 | 157 | 600 | 466 | 760 | 20000 | 10000 | 2500 |
|  | Difference between reaction start temperature and heating temperature | +21 | +22 | +24 | +20 | +13 | +52 | +25 | −3 | +16 |
|  | Glass transition temperature Tg [° C.] | 166 | 183 | 162 | 166 | 136 | 151 | — | 140 | 172 |
|  | Voids | A | A | A | A | A | C | C | A | C |
|  | Connectivity | A | A | A | C | A | C | C | B | B |
|  | Peelability | A | A | A | A | A | A | A | C | A |

REFERENCE SIGNS LIST

1 Semiconductor Device
2 Base Member
21 Conductor Wiring
3 Semiconductor Chip
31 Bump Electrode
40 Sheet Member
41 Encapsulant
6 Laminated Sheet

The invention claimed is:

1. An encapsulation resin composition for use to hermetically seal a gap between a base member and a semiconductor chip bonded onto the base member,
the encapsulation resin composition comprising:
an acrylic compound as Component (A);
a polyphenylene ether resin, having a substituent (b 1) with radical polymerization properties, as Component (B); and
a thermal radical polymerization initiator as Component (C),
wherein
the encapsulation resin composition has a reaction start temperature of 160° C. or less, and
a melt viscosity of the encapsulation resin composition is
200 Pa·s or less at the reaction start temperature,
400 Pa·s or less at any temperature which is equal to or higher than a temperature lower by 40° C. than the reaction start temperature and which is equal to or lower than the reaction start temperature, and
1,000 Pa·s or less at a temperature lower by 50° C. than the reaction start temperature.

2. The encapsulation resin composition of claim 1, further comprising an inorganic filler as Component (D).

3. The encapsulation resin composition of claim 1, wherein
the encapsulation resin composition has a sheet shape.

4. A laminated sheet comprising:
the encapsulation resin composition of claim 3; and
a supporting sheet to support the encapsulation resin composition thereon.

5. A cured product obtained by thermally curing the encapsulation resin composition of claim 1.

6. The cured product of claim 5, wherein
the cured product has a glass transition temperature equal to or higher than 100° C.

7. A semiconductor device comprising:
a base member;
a semiconductor chip bonded facedown onto the base member; and
an encapsulant to hermetically seal a gap between the base member and the semiconductor chip,
the encapsulant being made of the cured product of claim 5.

8. A method for fabricating a semiconductor device, the method comprising:
arranging a semiconductor chip having bump electrodes on one surface, having conductor wiring, of a base member with the encapsulation resin composition of claim 1 interposed between the semiconductor chip and the base member such that the conductor wiring faces the bump electrodes; and
applying ultrasonic vibrations to the encapsulation resin composition while heating the encapsulation resin composition to cure the encapsulation resin composition and electrically connect the conductor wiring to the bump electrodes.

* * * * *